Nov. 5, 1963 J. SHELLICK ETAL 3,109,234
METHOD OF MOUNTING A SEMICONDUCTOR DEVICE
Filed July 22, 1957

INVENTORS
JOSEPH SHELLICK &
ISRAEL KALISH
BY J. L. Whittaker
ATTORNEY

United States Patent Office 3,109,234 Patented Nov. 5, 1963

3,109,234

METHOD OF MOUNTING A SEMICONDUCTOR DEVICE

Joseph Shellick, Manville, and Israel Kalish, South Bound Brook, N.J., assignors to Radio Corporation of America, a corporation of Delaware Filed July 22, 1957, Ser. No. 673,320
7 Claims. (Cl. 29—470.1)

This invention relates to improved semiconductor devices, and to improved methods of fabricating them. More particularly, the invention relates to an improved method of providing thermal dissipation in PN junction-type semiconductor devices used in power applications.

An important class of semiconductor devices, known as transistors, usually comprises a semiconductive body having three regions or zones of different conductivity-type separated by two PN junctions. The zones may be arranged in PNP or NPN order. Such devices with regions of alternate conductivity type separated by rectifying barriers may be formed by several methods. One of these methods is the surface alloy process, in which two pellets that induce conductivity of given type are positioned on opposing surfaces of a monocrystalline semiconductive wafer of the opposite conductivity type. The assembly is then heated, so that the pellets melt and dissolve some of the wafer material. Upon cooling, the dissolved wafer material recrystallizes in the original semiconductor lattice, but contains sufficient pellet material to form a zone of the given conductivity type. At the interface between each recrystallized given conductivity type zone and the unchanged opposite conductivity type bulk of the wafer, a rectifying barrier is formed.

In surface alloyed transistors one of the two recrystallized regions is operated as the emitter, while the other region is operated as the collector. An ohmic non-rectifying contact is made to the bulk of the wafer, which constitutes the base region of the device. When an input signal is applied between the emitter and base electrodes, the emitter region injects minority carriers into the base region. Minority carriers in a semiconductor are charge carriers of type opposite to the conductivity type of the semiconductor. In a PNP transistor the base region is the N region, hence while the majority carriers in the base are N-type, the minority carriers in the base region are P-type defect electrons or holes. The minority carriers are injected at low impedance, diffused through the base region, and are collected at high impedance by the collector electrode, thereby producing power gain.

The operation of semiconductor devices generates unwanted heat. As in most electrical devices, the more power handled, the more heat generated. In devices of the transistor type, most of the heat is generated in the collector region. The generated heat must be dissipated, since otherwise the temperature of the device rises to a level at which the thermal energy elevates electrons across the energy gap from the valence band to the conduction band, so that the device is no longer operative. In most cases, temperatures above 100° C. change the nature of the semiconductor surface, so that the current gain is markedly decreased even before the temperature is attained at which thermal energy renders the device inoperative. It is desirable to keep the operating temperature of a transistor close to ambient temperature to simplify circuit stabilization. The dissipation of the generated heat is particularly important in the operation of power transistors, as the power handling capabilities of such devices depends on their rate of cooling. Transistors in which the semi-conductor wafer is germanium are generally not operative above about 100° C. Excessive heating may permanently injure or completely destroy semiconductor devices.

Various methods have been employed to dissipate the heat generated by semiconductive devices. For example, one solution of the problem of heat dissipation has been to immerse the semiconductor device in a metallic container filled with an oil or other liquid. However, the liquids generally used have been unsatisfactory because they do not provide sufficient heat dissipation, and because they often impair the electrical characteristics of the device by adversely affecting the surface of the semiconductor crystal.

A different method has been used for dissipating heat from devices such as alloy junction power transistors. The transistors have been bonded to heat dissipators, or heat sinks, which are usually comparatively large metallic bodies that absorb the heat generated by the device. The heat dissipator transfers the absorbed heat to a heat sink, such as a chassis, or directly to the atmosphere, which is the ultimate heat sink. An important problem in this method has been the production of a low-thermal-resistance connection between the device and the metallic body which absorbs and transfers the heat.

An object of this invention is to provide an improved semiconductor device suitable for power operations.

Another object is to improve heat dissipation in junction-type semiconductor devices.

But another object of this invention is to provide an improved junction transistor having good heat-dissipating characteristics and improved electrical characteristics.

A further object of the invention is to provide an improved method for manufacturing semiconductor devices.

Still another object of the invention is to provide an improved method of bonding a semiconductor device to a heat-dissipating structure.

Yet another object of the invention is to provide an improved connection with low thermal resistance between a power transistor and a heat dissipator.

Another object of the invention is to provide an improved method of mounting semiconductor devices to obtain improved cooling.

These and other objects are accomplished by the instant invention, which provides an improved room-temperature method of making a bond with low thermal resistance between a heat dissipator and a semiconductor device having at least one indium electrode. In a preferred form of the invention, the method comprises depositing a coating of indium on a heat dissipator base plate, and then exposing a fresh surface of the indium coating. The indium electrode of the semiconductor device is also treated to expose a fresh indium surface. The exposed electrode surface is then pressed against the indium coating on the heat dissipator while effecting angular rotation between the plate and the device. Since indium is weldable at relatively low temperatures and moderate pressures, molecular attraction causes the two fresh flat indium surfaces to coalesce and disappear. A single layer of indium is thus formed, and the device is thus bonded to the plate at room temperature. Since the base plate is fabricated from thermally and electrically conductive material, and the mass of the plate is relatively large compared to the mass of the device, the base not only provides mechanical support and electrical contact for the device, but also becomes a heat dissipator for cooling the unit. If desired, forced fluid cooling means may be provided within the heat dissipator.

The invention and its features will be more fully described by the following detailed description, in conjunction with the drawing, wherein.

Similar reference numerals are applied to similar elements throughout the drawing.

Figures 1, 2, 3, 4, 5, 6, 7, 8:
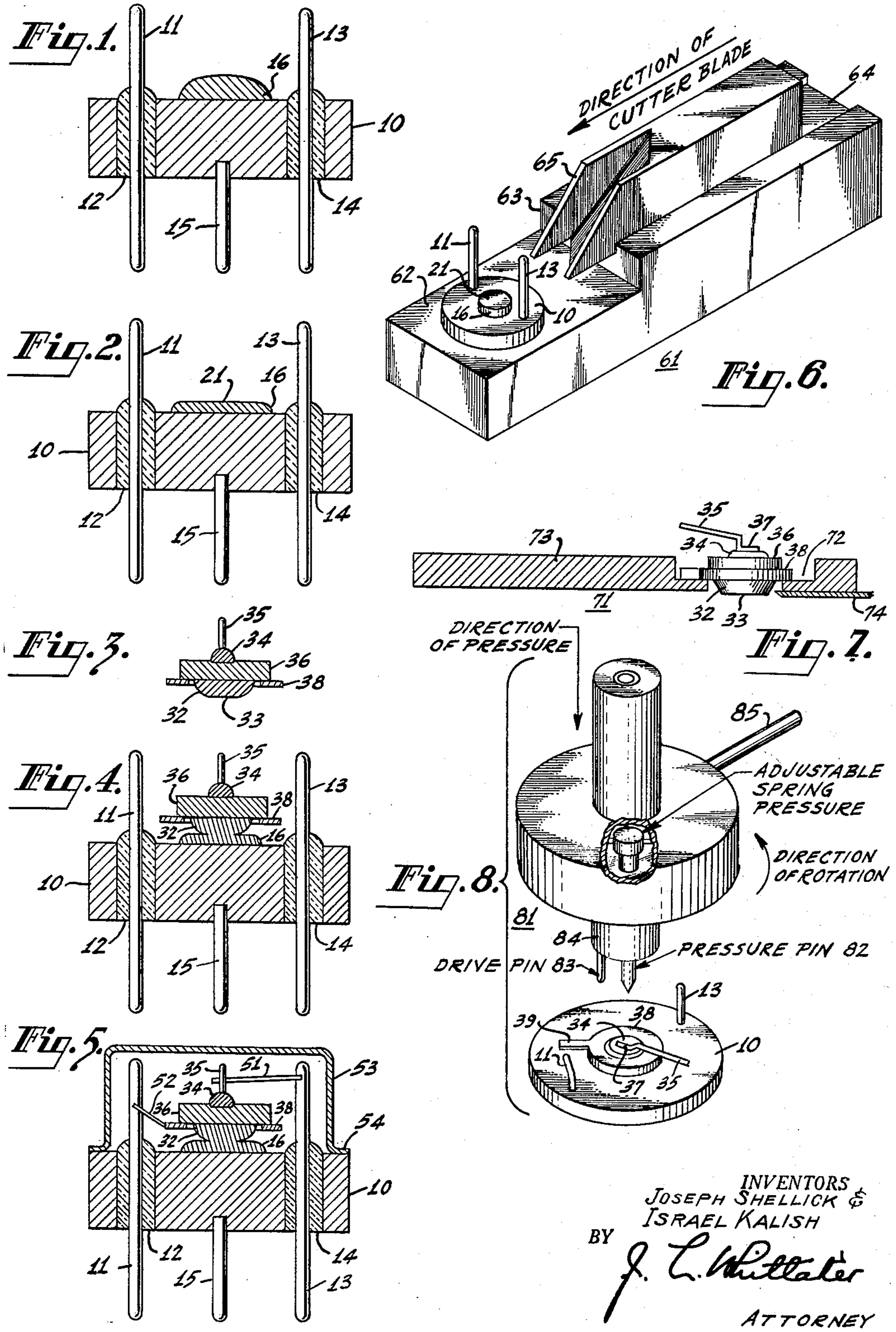
FIGURES 1–5 are sectional elevational views of a semiconductor device including a heat dissipator, showing successive steps in the fabrication of such a device in accordance with the method of this invention.
FIGURE 6 is a schematic perspective view of apparatus used to expose a fresh flat surface on an indium coating or layer which has been deposited on a base plate.
FIGURE 7 is a sectional view of apparatus used to expose a fresh flat surface on an indium electrode of a junction type semiconductor device.
FIGURE 8 is a schematic perspective view of apparatus used to impart pressure and relative rotation between the semiconductor device and the base plate which serves as a heat dissipator.

Referring to FIGURE 1, a base plate 10 is prepared from material having good thermal and electrical conductivity. A suitable material for this purpose is oxygen-free, high conductivity copper. The base plate 10 may be pierced to receive terminal leads or pins. In this example, the plate 10 holds a terminal lead or pin 11 in an eyelet 12 of an insulating material, such as glass. A second terminal lead or pin 13 is held in a similar insulating eyelet 14. A third pin 15 is in direct electrical and thermal contact with the bottom of plate 10. A coating or layer 16 of indium is deposited at the desired site on the upper surface of plate 10. For example, a pellet or disk of indium about 10 to 15 mils thick may be placed at the predetermined site, and the assembly then heated on a hot plate so that the indium melts and is fused to the desired location. The indium tends to ball up and assume a hemispherical shape.

Referring to FIGURE 2, the indium layer 16 which was originally about 10 to 15 mils thick, is shaved to a thickness of about 2 to 4 mils. A fresh indium surface 21 is thus exposed, which is preferably flat and parallel to the upper surface of plate 10.

Referring to FIGURE 3, a junction semiconductor device 31 containing an indium electrode 32 is first alloyed and etched by conventional methods. The incomplete device, which still requires mounting, making electrical connections, and casing, may also be designated as an assembly. The assembly may be of any type known to the art, such as diodes, triodes, tetrodes, unipolar transistors, and drift transistors, provided the type contains an indium electrode. In this example, the assembly is a surface alloyed triode transistor such as described generally in a paper by Law et al. entitled "A Developmental Germanium PNP Transistor," in the November 1952 Proceedings of the IRE. The transistor assembly consists of an indium emitter electrode pellet 34 and an indium collector electrode pellet 32 coaxially alloyed to opposite surfaces of a semiconductor wafer 36. The wafer may consist of germanium, silicon, or the like. In this example, the wafer is N-type germanium. A metal ring 38, which may for example be nickel, is ohmically soldered to the wafer 36 around the collector electrode 32. The ring 38 serves as the base tab, and has a tail 39 as shown in perspective in FIGURE 8. An emitter lead 35 is ohmically soldered to the emitter electrode pellet 34. The emitter lead 35 has a flattened end 37 soldered over the emitter pellet 34, as shown in FIGURE 7.

In this example both the emitter electrode and the collector electrode are indium, so that either electrode may be connected to the heat sink. However, it is preferred to connect the collector electrode 32 to the heat dissipator, since most of the heat generated by the operation of the device is produced at the collector. The fresh indium electrode surface 33 is prepared by slicing or shaving the collector pellet 32. The exposed indium surface 33 should preferably be flat and parallel to the germanium wafer 36.

Referring to FIGURE 4, the semiconductor assembly is positioned against the base plate 10 so that the fresh flat surface 33 of the indium collector electrode 32 is in contact with the fresh flat surface 21 of the indium layer 16 on the base plate 10. Preferably the exposed surfaces are less than 15 minutes old, since a surface film of oxides and impurities tends to form on indium in air, and clean indium surfaces are desired for the practice of the invention. A pressure of about 3500 to 7000 grams per square inch of exposed electrode surface 33 is applied between the device and the base plate 10. While maintaining the pressure, relative angular rotation is imparted between plate 10 and assembly. Either the plate or the assembly may be held fixed while the other is rotated. In this example, the base plate is held stationary while the assembly is rotated. The exact amount and speed of rotation is not critical. The combination of pressure and rotation of the assembly relative to the plate of between about 10 and 20 degrees is sufficient to cause the flat surface 33 of the indium electrode 32 to coalesce with the flat surface 21 of the indium layer 16. No heat is required in this operation, and a bond having low thermal resistance is thereby formed.

Referring to FIGURE 5, the base tab 38 is electrically connected to pin 11 by welding an electrically conductive wire 52, known as a jumper wire, between pin 11 and base tab 38. The emitter electrode 34 is electrically connected to pin 13 by welding jumper wire 51 between the emitter lead 35 and pin 13. The collector electrode 32, in addition to being in heat-conducting relation with the base plate 10, is also electrically conductive therewith. Hence the external electrical contact to the collector electrode 32 may be achieved by means of pin 15.

The final step is to case the assembly by any convenient method known to the art. In this example, a metallic cap 53 having a turned-out flange 54 is welded to the mounting surface of the plate 10 at the flange 54. All the welding steps are sufficiently remote from the semiconductive wafer 36 so as not to have any significant deleterious effects thereon.

The fresh clean flat surface of the indium layer and the indium dot may be exposed by any convenient method. For example, the indium layer and the indium electrode may be shaved by hand with a razor blade. The assembly may then be manually mounted on the base plate. However, it is preferred to use apparatus such as shown in FIGURES 6, 7, and 8 for mass production of semiconductor junction devices in accordance with this invention.

Referring to FIGURE 6, the base plate 10 bearing the indium pellet or disk 16 uppermost is positioned on the work table 62 of the shaving apparatus 61. Positioning is accomplished by inserting pins 11, 13, and 15 into recesses (not shown) in the work table 62. Adjacent the work table 62 of the apparatus is a raised portion 63 containing a slot 64, which holds and directs the cutting tool 65 over the indium disk 16. A single stroke of the cutting tool 65 across the indium disk 16 shaves off the upper portion of the disk 16, leaving a layer of indium about 2 to 4 mils thick, and exposing an indium surface 21 which is fresh, flat, and parallel to the face of the plate 10.

Referring to FIGURE 7, a fresh surface on the indium electrode 32 of the semiconductor assembly 31 is exposed by means of the slicing apparatus 71. The device 31 is placed in a recess 72 of a pivoted horizontal plate 73. The recess is deep enough to permit a part of the indium electrode 32 to protrude below the lower surface of the pivoted plate 73. A horizontal blade 74 is fixed just below the lower surface of the pivoted plate 73. On swinging the plate 73 against the blade 74, the protruding portion of the indium electrode 32 is sliced away, and a fresh flat indium surface 33 is exposed.

Referring to FIGURE 8, the apparatus 81 for mounting the semiconductor assembly 31 on the base 10 comprises a spring loaded pressure pin 82, and a drive pin 83, which are held in the lower end of an adjustable, vertically mounted, rotatable metal sleeve 84. The pressure pin 82 is coaxial with the metal sleeve 84, while the drive pin 83 is offset from the axis of sleeve 84. Attached to the sleeve 84 is a horizontal handle 85 which controls the rotation and height of the sleeve. In this example, the spring loaded pressure pin 82 is adjusted to exert a pressure of 5000 grams per square inch. The amount of rotation of the handle 85 is preset by two positive stops. In this example, the handle is preset to rotate approximately 18 degrees. The plate 10 is positioned in the apparatus 81 so that the freshly exposed surface 21 of indium layer 16 is directly below the pressure pin 82. After the electrode 32 of assembly 31 has been sliced in the apparatus shown in FIGURE 7, the assembly 31 is placed on plate 10 so that the fresh electrode surface 33 contacts the fresh surface 21 of the indium layer 16. The sleeve 84 is then lowered, so that the pressure pin 82 is forced against the flat portion 37 of the emitter lead 35. A pressure of about 5000 grams per square inch is thus exerted between the flat electrode surface 33 and the flat surface 21 of the indium layer. At the same time, the handle 85 is rotated approximately 18 degrees. This revolves the drive pin 83 against the tail 39 of the base tab 38, and hence causes the assembly 31 to rotate about 18 degrees. A bond is thus formed, in which the fresh electrode surface 33 is coalesced with the fresh surface 21 of the indium layer 16 on the base plate 10. The bond is mechanically strong, and has low thermal resistance.

To provide still further cooling, the heat dissipator 10 may be provided with a continuous channel (not shown), throughout which a fluid cooling means may be passed during operation of the device.

It will be understood that while the invention has been described by way of example in connection with a power transistor of the triode type, it is by no means limited by such application. Other types of semiconductor assemblies known to the art, and having a greater or smaller number of electrodes and PN junctions, may be similarly treated to provide good thermal dissipation. For example, a single junction semiconductor assembly known as a diode may be prepared by alloying an indium pellet to a surface of a wafer of N-conductivity type germanium. The indium pellet may then be shaved to expose a fresh flat surface, and mounted on a heat dissipating base plate by the method described above.

There has thus been described a novel structure and arrangement for efficiently dissipating heat in power semiconductor devices. The effect is obtained by making a bond having low thermal resistance between a device electrode where heat is generated, and a relatively large volume heat dissipator. Measurements indicate that the thermal resistance of the bond made in accordance with this invention is about 0.8° C. to 1° C. per watt dissipated, while in previous mounting methods the thermal resistance between the device and the heat sink has been about 2.5° C. per watt, or higher.

What is claimed is:

1. The method of bonding a semiconductor device including an indium electrode to a base plate, comprising the steps of shaving said indium electrode to expose a fresh flat indium surface, fusing an indium pellet on a base plate to form thereon an indium layer, shaving said indium layer to make it thin and to expose a fresh flat indium surface, positioning said device to said plate so as to contact said electrode surface to said surface of said indium layer, pressing said device to said plate, imparting sufficient angular rotation to said device so as to coalesce said two fresh indium surfaces, and terminating said pressing.

2. The method of bonding a semiconductor device including an indium electrode to a base plate, comprising the steps of shaving said indium electrode to expose a fresh flat indium surface, fusing an indium pellet on a predetermined portion of a thermally conductive base plate to form thereon and indium layer, shaving said indium layer to make it thin and to expose a fresh flat indium surface, contacting said exposed electrode surface to said exposed surface of said indium layer, pressing said device to said plate, imparting sufficient angular rotation to said device so as to coalesce said two fresh indium surfaces, and terminating said pressing.

3. The method of bonding a circuit element including an indium electrode to a base plate, comprising the steps of shaving said indium electrode to expose a fresh flat indium surface, fusing an indium pellet on a thermally and electrically conductive base plate to form thereon an indium layer about 10 to 15 mils thick, shaving said indium layer to a thickness of about 2 to 4 mils so as to expose a fresh flat indium surface, contacting said fresh electrode surface to said fresh surface of said indium layer, pressing said circuit element to said base plate, imparting sufficient angular rotation to said circuit element so as to coalesce said two fresh indium surfaces, and terminating said pressing.

4. The method of mounting on a base plate a semiconductor device including an indium electrode alloyed to a semiconductive wafer, comprising the steps of shaving said indium electrode to expose a fresh flat indium surface parallel to said wafer, fusing an indium pellet at a desired site on a thermally and electrically conductive base plate to form thereon an indium layer about 10 to 15 mils thick, shaving said indium layer to a thickness of about 2 to 4 mils so as to expose a fresh flat indium surface, contacting said fresh electrode surface to said fresh surface of said indium layer, pressing said device to said plate with a pressure of about 3500 to 7000 grams per square inch of exposed electrode surface, rotating said device about 10 degrees to 20 degrees while maintaining said pressure so as to coalesce said two fresh indium surfaces and bond said device to said base plate, and terminating said pressure.

5. The method of mounting on a base plate a semiconductor device including an indium electrode alloyed to a semiconductive wafer, comprising the steps of shaving said indium electrode to expose a fresh flat indium surface parallel to said wafer, fusing an indium pellet at a desired site on a thermally and electrically conductive base plate to form thereon an indium layer about 10 to 15 mils thick, shaving said indium layer to a thickness of about 2 to 4 mils so as to expose a fresh flat indium surface, contacting said fresh electrode surface to said fresh surface of said indium layer, pressing said device to said plate with a pressure of about 5000 grams per square inch of exposed electrode surface, rotating said device about 18 degrees while maintaining said pressure so as to coalesce said two fresh indium surfaces and bond said device to said base plate, and terminating said pressure.

6. The method of mounting on a base plate a semiconductor device including an indium electrode alloyed to a semiconductive wafer, comprising the steps of shaving said indium electrode to expose a fresh flat indium surface parallel to said wafer, fusing an indium pellet at a desired site on a thermally and electrically conductive base plate to form thereon an indium layer about 10 to 15 mils thick, shaving said indium layer to a thickness of about 2 to 4 mils so as to expose a fresh flat indium surface, contacting said fresh electrode surface to said fresh surface of said indium layer within 15 minutes after said surfaces have been exposed, pressing said device to said plate with a pressure of about 3500 to 7000 grams per square inch of exposed electrode surface, rotating said device about 10 to 20 degrees while maintaining said pressure so as to coalesce said two fresh indium surfaces and bond said device to said base plate, and terminating said pressure.

7. The method of mounting on a base plate a semiconductor device including an indium electrode alloyed to a semiconductive wafer, comprising the steps of shaving said indium electrode to expose a fresh flat indium surface parallel to said wafer, fusing an indium pellet at a desired site on a thermally and electrically conductive base plate to form thereon an indium layer about 10 to 15 mils thick, shaving said indium layer to a thickness of about 2 to 4 mils so as to expose a fresh flat indium surface parallel to said base plate, contacting said fresh electrode surface to said fresh surface of said indium layer within 15 minutes after said surfaces have been exposed, pressing said device to said plate with a pressure of about 5000 grams per square inch of exposed electrode surface, rotating said device about 18 degrees while maintaining said pressure so as to coalesce said two fresh indium surfaces and bond said device to said base plate, and terminate said pressure.

References Cited in the file of this patent

UNITED STATES PATENTS

| | | |
|---|---|---|
| 1,624,501 | Nelson | Apr. 12, 1927 |
| 1,661,448 | Taylor | Mar. 6, 1928 |
| 2,662,500 | Fort et al. | Dec. 15, 1953 |
| 2,671,746 | Brew | Mar. 9, 1954 |
| 2,730,663 | Harty | Jan. 10, 1956 |
| 2,731,704 | Spanos | Jan. 24, 1956 |
| 2,754,238 | Arenberg | July 10, 1956 |
| 2,763,822 | Frola et al. | Sept. 18, 1956 |
| 2,813,326 | Liebowitz | Nov. 19, 1957 |
| 2,829,422 | Fuller | Apr. 8, 1958 |
| 2,907,935 | Nagorsen | Oct. 6, 1959 |
| 2,984,774 | Race | May 16, 1961 |
| 3,002,271 | Thornton | Oct. 3, 1961 |

OTHER REFERENCES

Pressure Welding, article in The Welding Journal, August 1951, pp. 728–30.